(12) United States Patent
Yu et al.

(10) Patent No.: US 10,861,773 B2
(45) Date of Patent: Dec. 8, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW); Chun-Hui Yu, Hsinchu County (TW); Kuo-Chung Yee, Taoyuan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 15/690,283

(22) Filed: Aug. 30, 2017

(65) Prior Publication Data

US 2019/0067169 A1    Feb. 28, 2019

(51) Int. Cl.
*H01L 23/00*    (2006.01)
*H01L 23/495*    (2006.01)
(Continued)

(52) U.S. Cl.
CPC ........ *H01L 23/49503* (2013.01); *H01L 21/56* (2013.01); *H01L 21/561* (2013.01); *H01L 21/6835* (2013.01); *H01L 23/3114* (2013.01); *H01L 23/5389* (2013.01); *H01L 24/02* (2013.01); *H01L 24/06* (2013.01); *H01L 24/18* (2013.01); *H01L 24/19* (2013.01); *H01L 24/20* (2013.01); *H01L 24/25* (2013.01); *H01L 24/96* (2013.01); *H01L 24/97* (2013.01); *H01L 21/568* (2013.01); *H01L 23/3128* (2013.01); *H01L 24/05* (2013.01); *H01L 2221/68359* (2013.01); *H01L 2221/68372* (2013.01); *H01L 2224/023* (2013.01); *H01L 2224/024* (2013.01); *H01L 2224/02375* (2013.01); *H01L 2224/02381* (2013.01); *H01L 2224/0401* (2013.01); *H01L 2224/04105* (2013.01); *H01L 2224/05558* (2013.01); *H01L 2224/05569* (2013.01); *H01L 2224/05572* (2013.01); *H01L 2224/05647* (2013.01); *H01L 2224/05655* (2013.01);

(Continued)

(58) Field of Classification Search
CPC . H01L 2224/023–024; H01L 24/18–25; H01L 2224/18–225; H01L 2224/82–82986; H01L 2224/06051; H01L 2224/09051–09055

See application file for complete search history.

(56) References Cited

U.S. PATENT DOCUMENTS 8,987,922 B2    3/2015   Yu et al.
9,000,584 B2    4/2015   Lin et al.
(Continued)

*Primary Examiner* — Mary A Wilczewski
*Assistant Examiner* — Tsz K Chiu
(74) *Attorney, Agent, or Firm* — JCIPRNET

(57) ABSTRACT

A semiconductor package and a manufacturing method for the semiconductor package are provided. The semiconductor package at least has chip and a redistribution layer. The redistribution layer is disposed on the chip. The redistribution layer includes joining portions having first pads and second pads surrounding the chip. The first pads are arranged around a location of the chip and the second pads are arranged over the location of the chip. The second pads located closer to the chip are narrower than the first pads located further away from the chip.

20 Claims, 11 Drawing Sheets

(51) Int. Cl.
  *H01L 21/56* (2006.01)
  *H01L 21/683* (2006.01)
  *H01L 23/31* (2006.01)
  *H01L 23/538* (2006.01)

(52) U.S. Cl.
  CPC ............... *H01L 2224/05666* (2013.01); *H01L 2224/05684* (2013.01); *H01L 2224/0603* (2013.01); *H01L 2224/06051* (2013.01); *H01L 2224/06102* (2013.01); *H01L 2224/06181* (2013.01); *H01L 2224/09051* (2013.01); *H01L 2224/09055* (2013.01); *H01L 2224/12105* (2013.01); *H01L 2224/14181* (2013.01); *H01L 2224/18* (2013.01); *H01L 2224/225* (2013.01); *H01L 2224/24137* (2013.01); *H01L 2224/32225* (2013.01); *H01L 2224/73267* (2013.01); *H01L 2224/82* (2013.01); *H01L 2224/82986* (2013.01); *H01L 2224/92244* (2013.01); *H01L 2224/97* (2013.01); *H01L 2225/1035* (2013.01); *H01L 2924/18162* (2013.01); *H01L 2924/37001* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,171,823 B2* | 10/2015 | Gan | H01L 24/24 |
| 9,196,532 B2 | 11/2015 | Tu et al. | |
| 9,196,559 B2 | 11/2015 | Tsai et al. | |
| 9,224,680 B2* | 12/2015 | Chen | H01L 23/49833 |
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,490,192 B1* | 11/2016 | Chen | H01L 24/20 |
| 9,496,189 B2 | 11/2016 | Yu et al. | |
| 9,922,896 B1* | 3/2018 | Cheng | H01L 24/03 |
| 10,153,234 B2* | 12/2018 | Hu | H01L 23/5386 |
| 2006/0226527 A1* | 10/2006 | Hatano | H01L 23/5389 257/686 |
| 2008/0217384 A1* | 9/2008 | Jayantha, Sr. | B23K 1/0016 228/180.21 |
| 2009/0206455 A1* | 8/2009 | Harper | H01L 23/3128 257/659 |
| 2011/0235296 A1* | 9/2011 | Shi | H01L 24/14 361/783 |
| 2013/0228897 A1* | 9/2013 | Chen | H01L 24/05 257/621 |
| 2013/0241052 A1* | 9/2013 | Chang | H01L 23/49816 257/737 |
| 2014/0061900 A1* | 3/2014 | Park | H01L 21/4853 257/737 |
| 2014/0091471 A1* | 4/2014 | Chen | H01L 24/19 257/770 |
| 2014/0252632 A1* | 9/2014 | Barth | H01L 23/5384 257/773 |
| 2015/0070865 A1* | 3/2015 | Yew | H05K 1/11 361/783 |
| 2015/0097286 A1* | 4/2015 | Suen | H01L 22/12 257/737 |
| 2015/0162289 A1* | 6/2015 | Chang | H01L 24/96 257/750 |
| 2015/0287700 A1* | 10/2015 | Yu | H01L 23/5386 257/774 |
| 2015/0364386 A1* | 12/2015 | Yu | H01L 22/20 257/48 |
| 2016/0027747 A1* | 1/2016 | Ryu | H01L 24/05 257/737 |
| 2017/0141056 A1* | 5/2017 | Huang | H01L 24/19 |
| 2018/0190514 A1* | 7/2018 | Baloglu | H01L 21/568 |

* cited by examiner

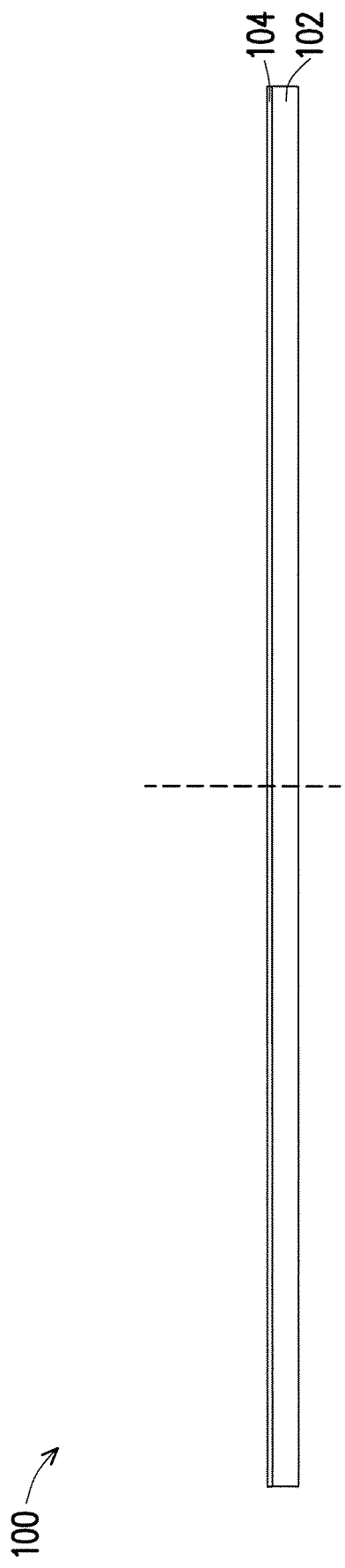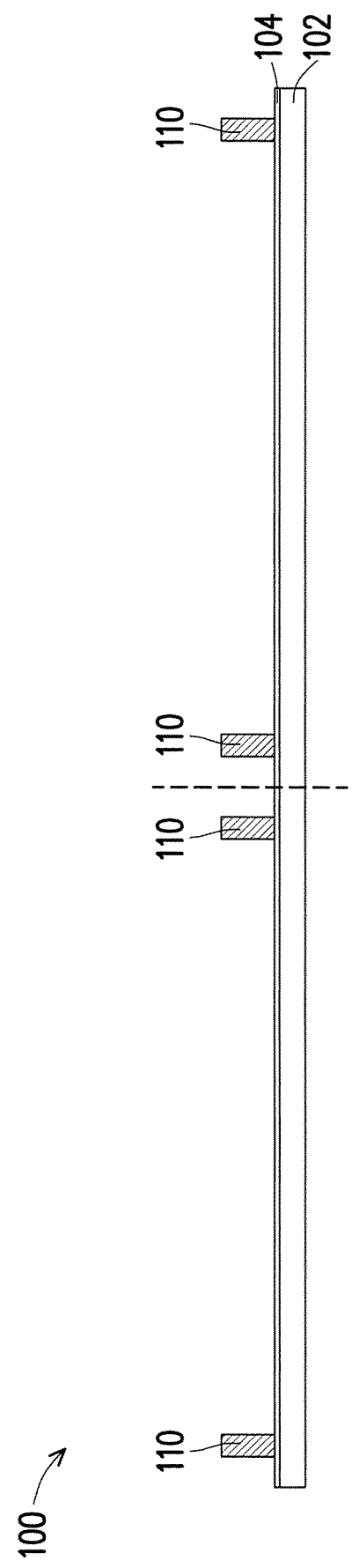

SEMICONDUCTOR PACKAGE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and redistribution layers are included for routing and interconnecting the dies and/or semiconductor devices for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 8 are schematic cross sectional views of various stages in a manufacturing method of a semiconductor package according to some exemplary embodiments of the present disclosure.

FIG. 5' is a schematic enlarged partial cross sectional view showing a portion of the structure of FIG. 5.

DETAILED DESCRIPTION

Figure 3:
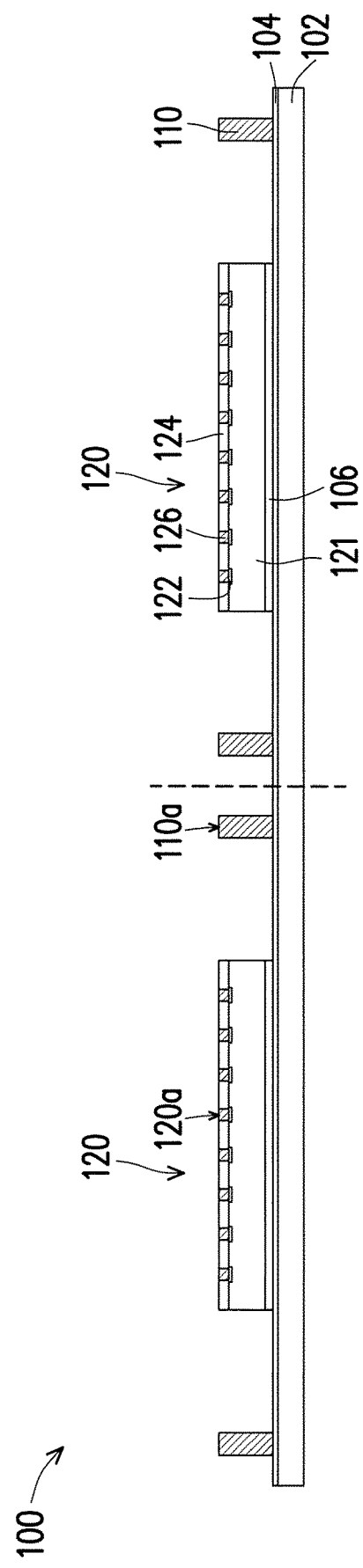

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 8 are schematic cross sectional views of various stages in a manufacturing method of a semiconductor package according to some exemplary embodiments. In exemplary embodiments, the semiconductor manufacturing method is part of a wafer level packaging process. In some embodiments, two dies are shown to represent plural dies of the wafer, and one or more packages 10 are shown to represent plural semiconductor packages obtained following the semiconductor manufacturing method. Referring to FIG. 1, in some embodiments, a carrier 102 is provided, and the carrier 102 may be a glass carrier or any suitable carrier for the manufacturing method of the semiconductor package. In some embodiments, the carrier 102 is provided with a debond layer 104 coated thereon, and the material of the debond layer may be any material suitable for debonding the carrier 102 from the above layers or die(s) disposed thereon. Referring to FIG. 2, in some embodiments, through interlayer vias (TIVs) 110 are formed on the carrier 102. In some embodiments, the TIVs 110 are through integrated fan-out (InFO) vias. In some embodiments, the TIVs 110 may be formed by forming a mask pattern (not shown) on the debond layer 104 with openings exposing the debond layer 104 on the carrier 102, forming a metallic material filling the openings to form the TIVs by electroplating or deposition and then removing the mask pattern. In some embodiments, as shown in FIG. 2, the dotted line represents the cutting line of the package structure 100 in the subsequent cutting process and the TIVs 110 may be arranged close to and/or along the cutting line but not on the cutting line. In alternative embodiments, the TIVs are optional and the formation of the TIVs may be omitted.

Referring to FIG. 3, dies 120 are provided and placed over the carrier 102. In some embodiments, a die attach film 106 is provided between the debond layer 104 and the dies 120 for better adhering the dies 120 to the debond layer 104 of the carrier 102. In exemplary embodiments, as shown in FIG. 3, the dies 120 may include different types of dies or the same types of dies. In some embodiments, the die 120 may include one or more types of chips selected from application-specific integrated circuit (ASIC) chips, analog chips, sensor chips, wireless and radio frequency chips, voltage regulator chips or memory chips. In certain embodiments, dies and chips may be used interchangeably. In certain embodiments, the die 120 is provided with contacts or pads 122 on the substrate 121 of the die 120, a passivation layer 124 formed over the substrate 121 with openings exposing the pads 122 and conductive posts 126 located within the openings and connected to the pads 122. In some embodiments, the pads 122 are aluminum pads, copper pads or other suitable metallic pads. In some embodiments, the material of the passivation layer 124 includes silicon nitride, silicon oxynitride, a polymer material or a dielectric material. In some embodiments, the conductive posts 124 are copper posts or copper alloy posts. In one embodiment, the die 120 is provided and bonded to the carrier 102 with its active surface 120a facing upward (as seen in FIG. 3). In certain embodiments, the TIVs 110 are arranged along the periphery of the die(s) 120. However, depending on product design, some of the TIVs 110 may be arranged at locations other than the periphery of the die 120. In certain embodiments, in addition to the dies 120 stacked over the carrier 102 side-by-side as shown in FIG. 3, the package structure 100 may further include other dies stacked at different levels, and the number of the dies arranged side-by-side or stacked over another die(s) may be adjusted or modified based on the product design but are not limited by the exemplary embodiments.

Figure 4:
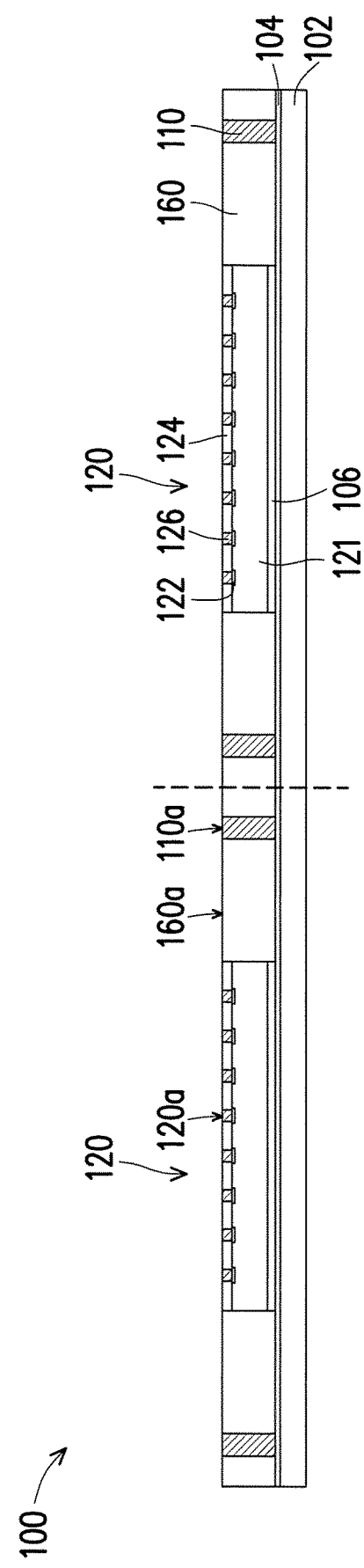

Referring to FIG. 4, in some embodiments, the dies 120 and the TIVs 110 located over the carrier 102 are molded and encapsulated in a molding compound 160. In one embodiment, the molding compound 160 fills the space between the dies 120 and the TIVs 110 and covers the dies 120 and the TIVs 110 over the debond layer 104. In one embodiment, the material of the molding compound 160 includes epoxy resins, phenolic resins or silicon-containing resins. In some embodiments, the molding compound 160 is then planarized to expose tops 110a of the TIVs 110 and the active surfaces 120a of the dies 120. In some embodiment, the over-molded molding compound 160 and the TIVs 110 are polished until the conductive posts 126 of the dies 120 are exposed. In one embodiment, after the planarization, the tops 110a of the TIVs 110, the top surface 160a of the molding compound 160, and the active surface 120a of the dies 120 become substantially levelled and flush with one another. In some embodiments, the molding compound 160 and/or the TIVs 110 are planarized through a grinding process or a chemical mechanical polishing (CMP) process.

Figure 5:
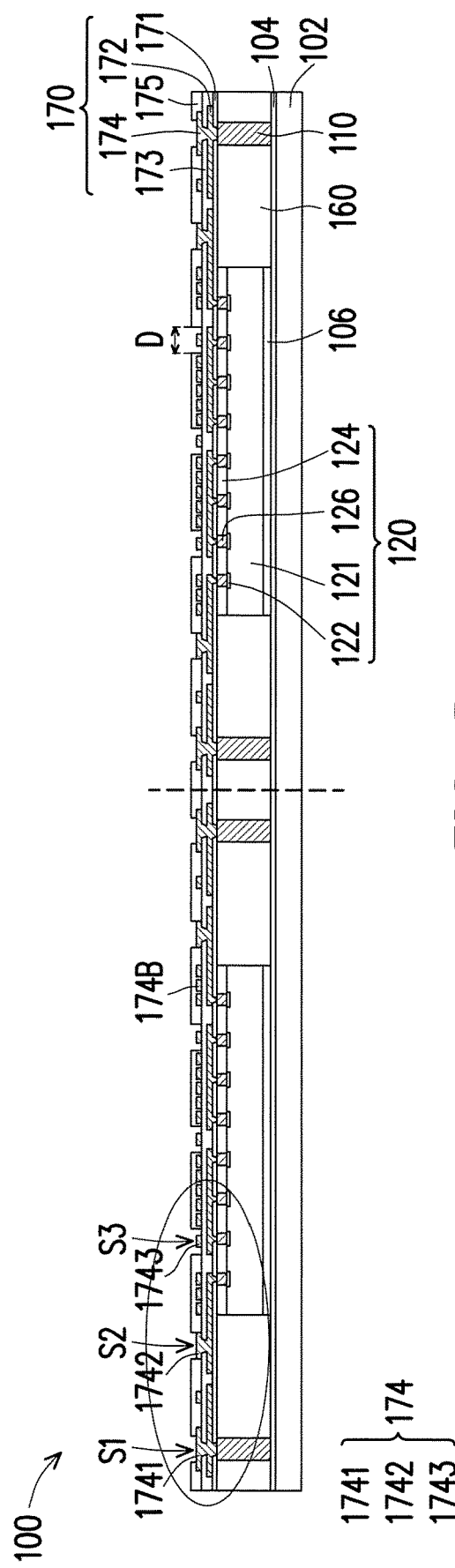
Figure 5:
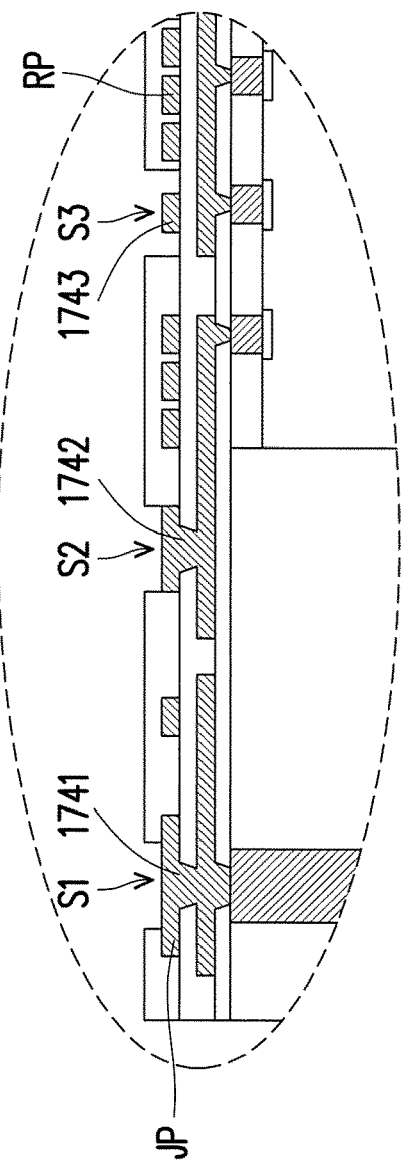

Referring to FIG. 5, in some embodiments, a redistribution layer 170 is formed on the molding compound 160, over the TIVs 110 and on the dies 120. In some embodiment, the redistribution layer 170 is electrically connected to the TIVs 110 and the dies 120. The formation of the redistribution layer 170 includes sequentially forming more than one dielectric material layers and more than one metallization layers in alternation.

Referring to FIG. 5, in certain embodiments, the redistribution layer 170 is formed by sequentially forming a lower dielectric material layer 171, a first metallization layer 172, a middle dielectric material layer 173, a second metallization layer 174 and a top dielectric material layer 175 on the molding compound 160, over the TIVs 110 and on the dies 120. In some embodiments, the formation of the redistribution layer 170 includes forming the lower dielectric material layer 171 with openings exposing the conductive posts 126 of the dies 120, forming a metal layer (not shown) over the lower dielectric material layer 171 filling the openings, and patterning the metal layer to form the first metallization layer 172. In some embodiments, the formation of the redistribution layer 170 further includes forming the middle dielectric material layer 173 with openings exposing portions of the first metallization layer 172, forming another metal layer (not shown) over the middle dielectric material layer 173 filling the openings, and then patterning the metal layer to form the second metallization layer 174. In some embodiments, the formation of the redistribution layer 170 further includes forming the top dielectric material layer 175 with openings S1, S2 and S3 exposing portions of the second metallization layer 174. In some embodiments, the first metallization layer 172 is electrically connected with the dies 120 through the conductive posts 126 and is electrically connected with the TIVs 110. In some embodiments, the second metallization layer 174 is electrically connected with the first metallization layer 172.

In some embodiments, the materials of the dielectric material layers 171, 173, 175 may be the same or different. In some embodiments, the materials of the dielectric material layers 171, 173, 175 include one or more polymer dielectric materials such as polyimide, benzocyclobutene (BCB), polybenzooxazole (PBO), or any other suitable polymer-based dielectric materials. In some embodiments, the materials of the metallization layers 172, 174 may be the same or different, and the materials of the metallization layers 172, 174 may be selected from copper, nickel, aluminum, tungsten or combinations thereof.

FIG. 5' is a schematic enlarged partial cross sectional view showing a portion of the redistribution layer 170 of FIG. 5. In some embodiments, the second metallization layer 174 has joining portions 174A, including contact pads such as ball pads, and routing portions 174B, including trace lines such as routing traces or fan-out traces. In certain embodiments, the joining portions 174A of the second metallization layer 174 are exposed by the top dielectric material layer 175, while the routing portions 174B are covered by the top dielectric material layer 175. In some embodiments, the joining portions 174A includes first pads 1741, second pads 1742 and third pads 1743 respectively exposed by the openings S1, S2 and S3. In some embodiments, a seed layer (not shown) may be formed on top surfaces of the pads 1741, 1742, 1743 for better adhesion between the pads and the top dielectric material layer 175. In some embodiments, the first, second and third pads 1741, 1742, 1743 are of different shapes and sizes, while the first, second and third openings S1, S2 and S3 are of the same shape and of the same size. In some embodiments, the first, second and third openings S1, S2 and S3 are round openings with the same diameter D.

Figure 6:
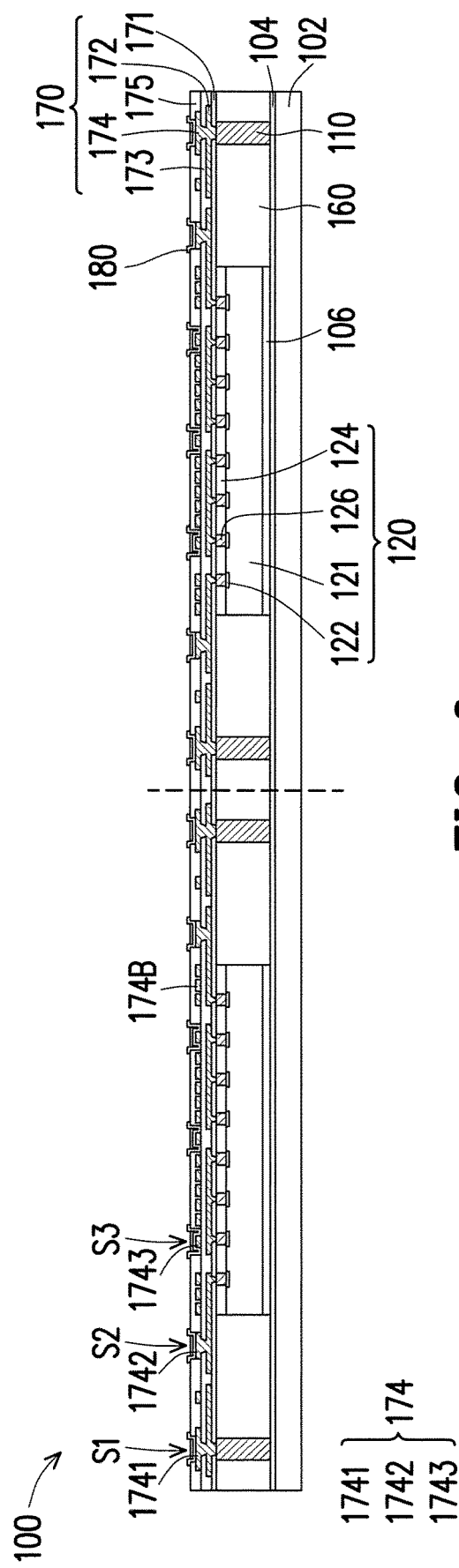

Referring to FIG. 6, under-ball metallurgy (UBM) patterns 180 are formed on the joining portions 174A. In some embodiments, the UBM patterns 180 are disposed on the exposed top surfaces of the first, second and third pads 1741, 1742, 1743, for electrically connecting with the subsequently formed conductive elements. As shown in FIG. 6, for example, the UBM patterns 180 are formed covering the openings S1, S2, S3 and the first, second and third pads 1741, 1742, 1743 exposed by the openings S1, S2, S3 and portions of the top dielectric material layer 175. In some embodiments, the UBM patterns 180 are formed conformal to the profiles of the openings S1, S2, S3 and the pads 1741, 1742, 1743. In some embodiments, the sizes of the UBM patterns 180 correspond to the sizes of the openings S1, S2, S3. In one embodiment, the openings S1, S2, S3 has substantially the same size, and the respectively formed UBM patterns 180 may be of one size. In some embodiments, the materials of the UBM patterns 180 may include copper, nickel, titanium, tungsten, alloys and/or combinations thereof. In some embodiments, the UBM patterns 180 may be formed by sputtering, electroplating or deposition, for example. In alternative embodiments, the formation of the UBM patterns may be optional and omitted for the package structure 100. In some embodiments, no UBM patterns are formed before bonding the conductive elements to the pads of the joining portions, but a seed layer may be formed on the surfaces of the pads for enhancing adhesion between the pads and the overlying dielectric material layer and between the pads and the subsequently disposed conductive elements.

Figure 7:
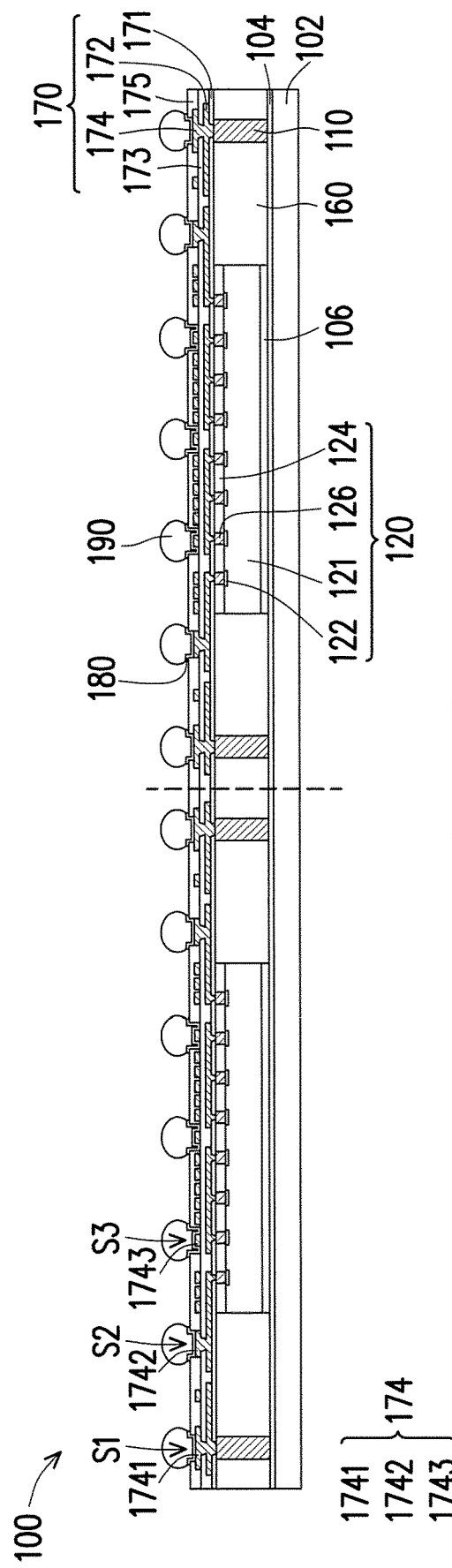

Referring to FIG. 7, conductive elements 190 are disposed on the UBM patterns 180. In some embodiments, the conductive elements 190 may be disposed on and fixed to the UBM patterns 180 by performing a ball placement process and then through a reflow process. In some embodiments, the conductive elements 190 are, for example, solder balls or ball grid array (BGA) balls. In some embodiments, the conductive elements 190 are connected to the UBM patterns 180 through a solder flux. As shown in the FIG. 7, some of the conductive elements 190 are electrically connected to the dies 120 through the joining portions 174A of the second metallization layer 174 and the first metallization layer 172, and some of the conductive elements 190 are electrically connected to the TIVs 110 through the joining portions 174A of the second metallization layer 174 and the first metallization layer 172.

Figure 8:
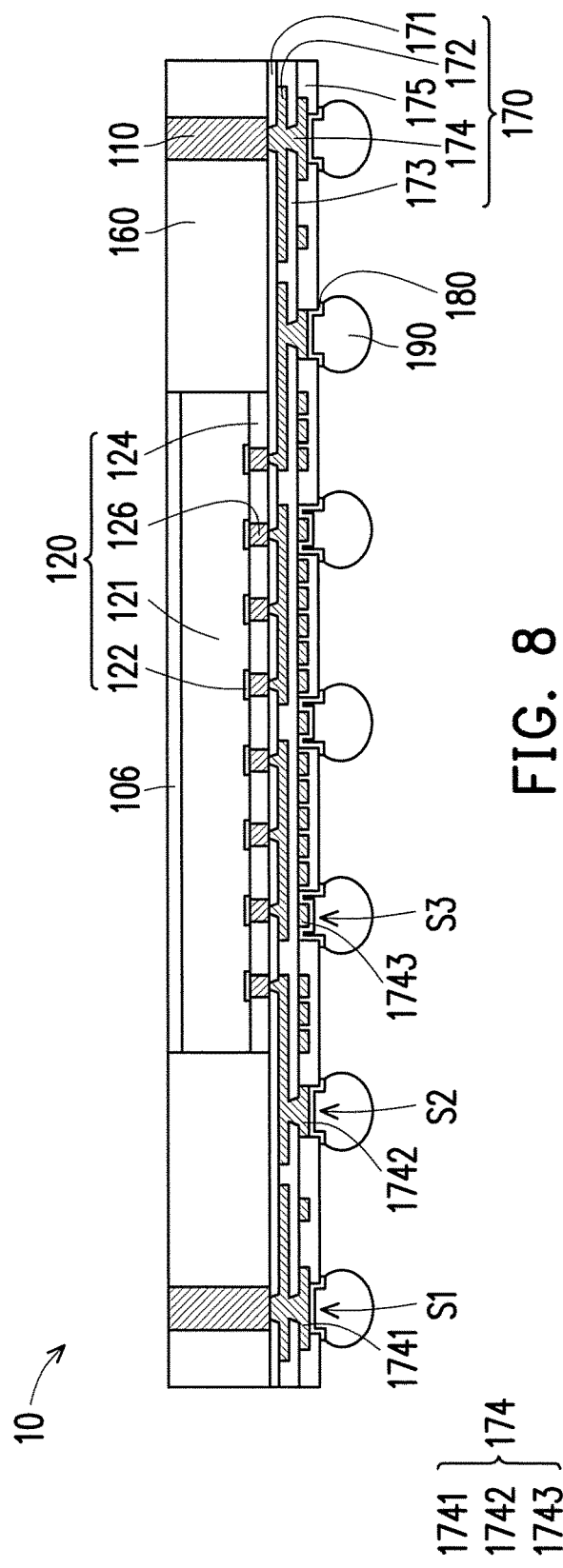

Referring to FIGS. 7-8, in some embodiments, the package structure is flipped (turned upside down) and the carrier 102 is removed from the molding compound 160 and the dies 110. In some embodiments, a dicing process is later performed to cut the whole package structure 100 (at least cutting though the redistribution layer 170 and the molding compound 160) along the cutting line (the dotted line) into individual and separated semiconductor packages 10. In one embodiment, the dicing process is a wafer dicing process including mechanical sawing or laser cutting.

In alternative embodiments, the semiconductor package 10 may further include additional dies or sub-package units disposed over the die 110 and another redistribution layer(s) may be formed to electrically connect the additional dies or sub-package units. The structures and/or the processes of the present disclosure are not limited by the exemplary embodiments.

Figure 9A:
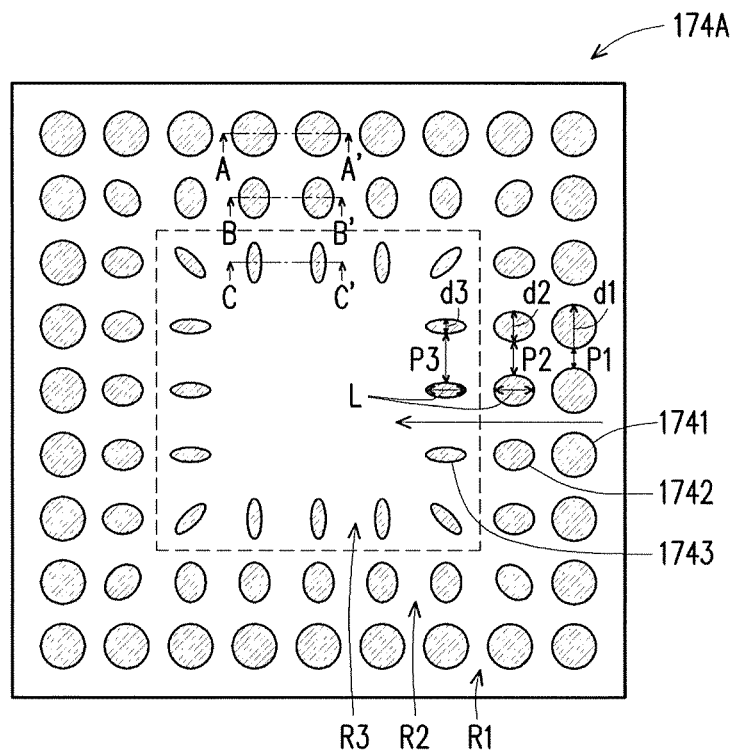
FIG. 9A is a schematic top view illustrating the exemplary layout of the joining portions of the redistribution layer in a package structure according to some exemplary embodiments of the present disclosure.
Figure 9B:
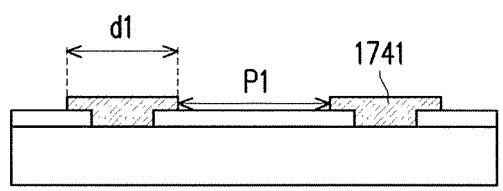
FIGS. 9B-9D are schematic cross sectional views illustrating the first, second and third pads of the joining portions in FIG. 9A respectively along the cross section lines A-A', B-B' and C-C'.
Figure 9C:
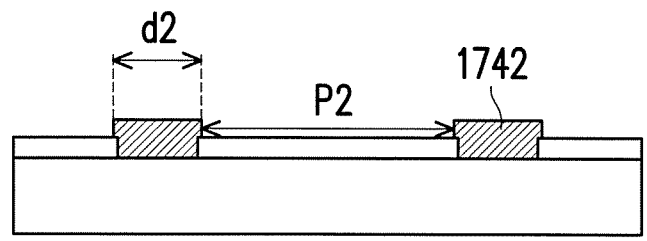
Figure 9D:
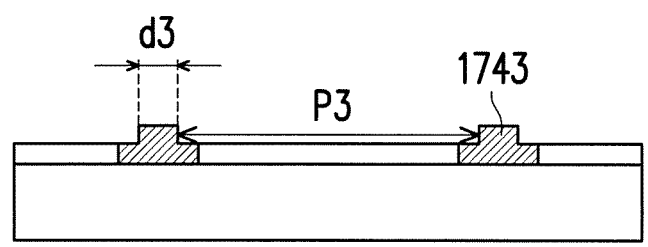

FIG. 9A is a schematic top view illustrating the exemplary layout of the joining portions 174A of the redistribution layer 170 in the package structure according to some exemplary embodiments of the present disclosure. In FIG. 9A, the routing portions 174B are not shown for illustration purposes. FIGS. 9B-9D are schematic cross sectional views illustrating the first, second and third pads of the joining portions in FIG. 9A respectively along the cross section lines A-A', B-B' and C-C'. In FIG. 9A, the dotted line represents the location of the die. In some embodiments, as seen in FIG. 9A, the first, second and third pads 1741, 1742, 1743 are arranged in ring shapes surrounding the die around the location of the die. In certain embodiments, the first pads 1741 are round pads, and the first pads 1741 of the first size d1 (i.e. the diameter of the round pad) are arranged with a fixed spacing P1 in a shape of a first rectangular ring (referred to as the first ring R1). In certain embodiments, the second pads 1742 are elliptical pads, and the second pads 1742 of the first size d2 (i.e. the length at the semi-minor axis) are arranged with a fixed spacing P2 in a shape of a second rectangular ring (referred to as the second ring R2). In certain embodiments, the third pads 1743 are elliptical pads and the third pads 1743 of the first size d3 (i.e. the length at the semi-minor axis) are arranged with a fixed spacing P3 in the shape of a third rectangular ring (referred to as the third ring R3). Compared with the round pads, the elliptical pads are narrower at the semi-minor axis, and the length at the semi-minor axis is referred as the width of the elliptical pads. In some embodiments, the first pads 1741 are arranged most far away from the die, while the third pads 1743 are arranged closest to the die. In some embodiments, the third pads 1743 are arranged above and distributed over the location of the underlying die. The pad arranged closer or farer to the chip or die (or the periphery of the chip or die) is decided by the shortest distance of the pad to the periphery of the chip or die. In addition, the pad located over or above the chip location is considered located closer to the chip or die when compared with the pad located around or surrounding the chip location. In some embodiments, the second pads 1742 are arranged between the first and third pads 1741, 1743. In some embodiments, the first size d1 is larger than the second size d2 and the second size d2 is larger than the third size d3. In some embodiments, the size d1 of the round pads is substantially the same as the length L at the semi-major axis of the elliptical pads, but is different from the length d2, d3 at the semi-minor axis of the elliptical pads. In some embodiments, the shrinking ratios may range from 0.99 to 0.50. In some embodiments, the shrinking ratios may range from 0.9 to 0.8. Taking the shrinking ratio being 0.9 as an example, d2 is about 0.9*d1, and d3 is about 0.9*d2 or 0.81*d1. That is, at least one dimension of these pads (e.g. the size d1 of the round pads or the length L at the semi-major axis of the elliptical pads) remains to be the same (unchanged) and the pads arranged closer to the die are smaller in sizes at the semi-minor axis (for the elliptical pads). In certain embodiments, all these pads have one dimension (e.g. length) set to be the same (i.e. the diameter d1 of the round pads being equivalent to the length L at the semi-major axis of the elliptical pads) along the direction approaching a periphery of the die (e.g. radial inward direction shown as the arrow), while the pads become narrower in another dimension (e.g. width, along the direction at a 90 degree angle to the radial inward direction). In certain embodiments, the set dimension (e.g. the diameter of the round pads or the length at the semi-major axis of the elliptical pads) of the pads is predetermined and correspond to the size of the subsequently disposed conductive elements or balls.

Figure 10A:
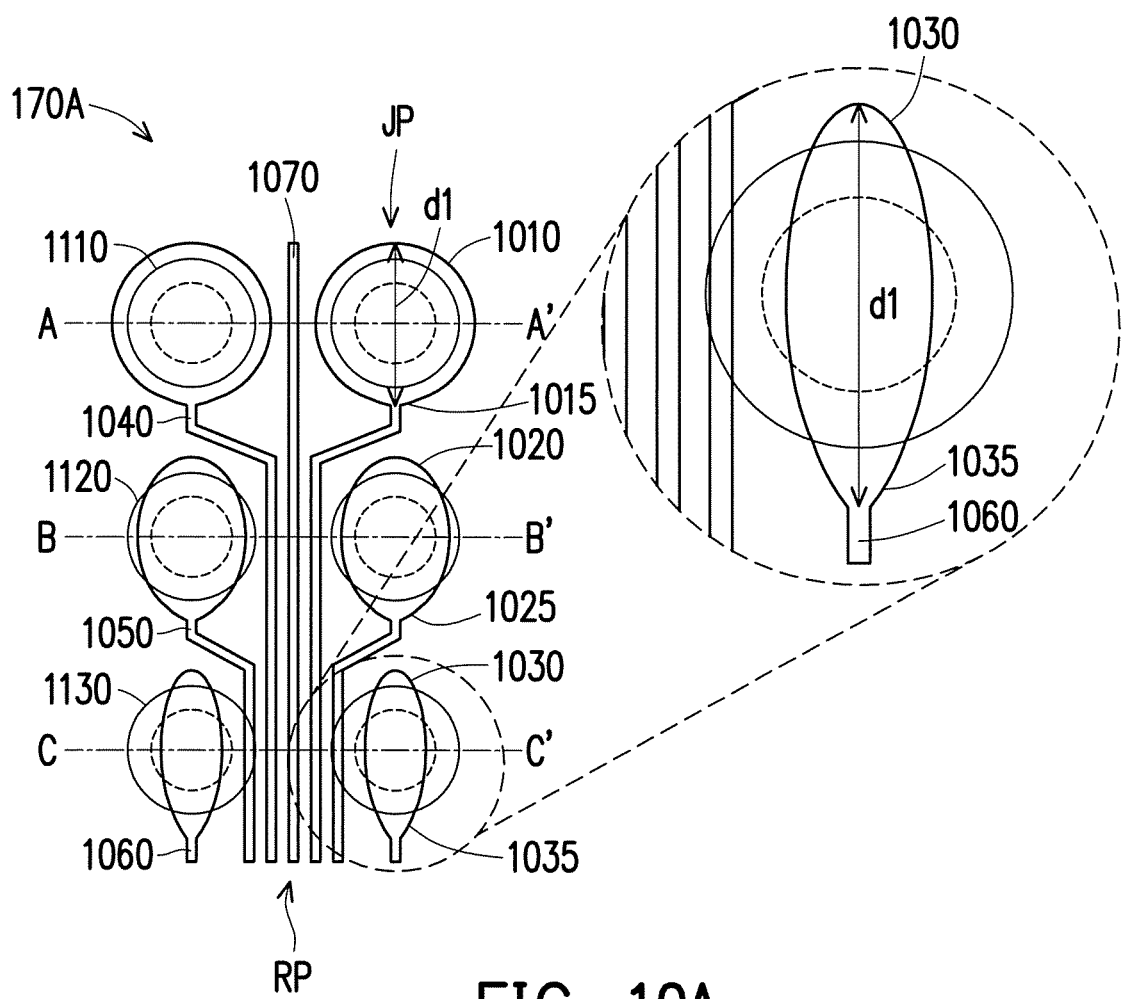
FIG. 10A is a schematic top view illustrating the exemplary layout of a portion of the redistribution layer in the package structure according to some exemplary embodiments of the present disclosure.
Figure 10B:
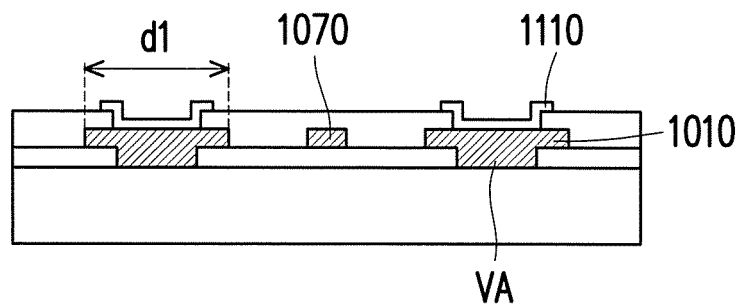
FIGS. 10B-10D are schematic cross sectional views illustrating the first, second and third pads of the joining portions JP in FIG. 10A respectively along the cross section lines A-A', B-B' and C-C'.
Figure 10C:
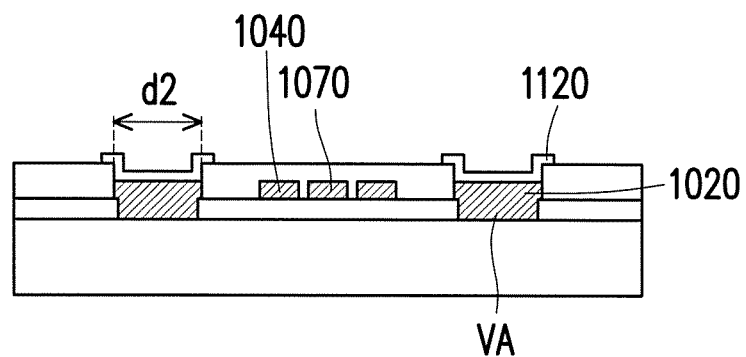
Figure 10D:
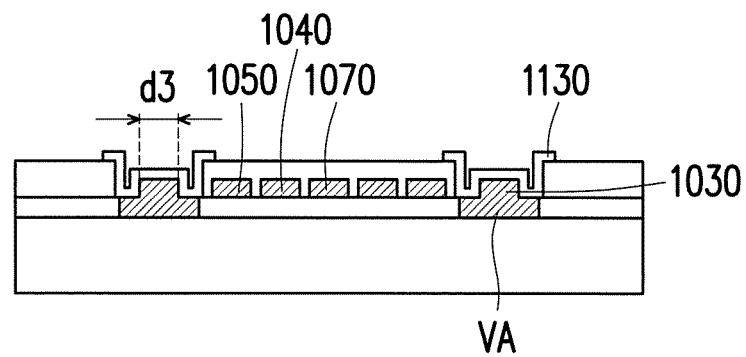

In certain embodiments, by arranging elliptical pads in the inner region surrounding the die and round pads in the outer region surrounding the die, larger space allowance between the adjacent pads are saved for routing portions or traces passing through there-between, thus enhancing the layout flexibility and improving the reliability of the package. In certain embodiments, the pads closer to the die, the shorter the sizes at the semi-minor axis of the elliptical pads. In certain embodiments, the changes in sizes at the semi-minor axis of the pads may be in a linear relationship or a non-linear relationship relative to the distance between the die and the pad(s). In some embodiments, the decrease in sizes at the semi-minor axis of the pads may be in a stepwise manner relative to the distance between the die and the ring(s) of the pads. In some embodiments, the pads most distant from the die may be round pads. In the exemplary embodiments, round pads and elliptical pads are used as examples, but the shapes of the pads are not limited by the embodiments herein and other polygonal shapes may be adopted FIG. 10A is a schematic top view illustrating the exemplary layout of a portion of the redistribution layer in the package structure according to some exemplary embodiments of the present disclosure. In FIG. 10A, the UBM patterns are shown to illustrate the relative locations and sizes of the UBM patterns and joining portions JP and routing portions RP of the redistribution layer 170A. In FIG. 10A, the location of the via portions VA connected to the joining portions JP are shown as dotted lines. FIGS. 10B-10D are schematic cross sectional views illustrating the first, second and third pads of the joining portions JP in FIG. 10A respectively along the cross section lines A-A', B-B' and C-C'.

In FIG. 10A, in some embodiments, portions of the joining portions JP of the redistribution layer 170A are connected with portions of the routing portions RP. In some embodiments, the joining portions JP include first pads 1010, second pads 1020 and third pads 1030, and the routing portions RP include first routing traces 1040, second routing traces 1050, third routing traces 1060 and fourth routing trace 1070. Referring to FIGS. 10A-10D, in certain embodiments, the first pads 1010 are connected with the first routing traces 1040 through first joining neck portions 1015 of the first pads 1010. In some embodiments, the first pad 1010 may be shaped as an almost round pad with the first joining neck portion 1015 protruding outward and tapering from the pad 1010 to the first routing trace 1040. In certain embodiments, the second pads 1020 are connected with the second routing traces 1050 through second joining neck portions 1025 of the second pads 1020. In some embodiments, the second pad 1020 may be shaped as an almost elliptical pad with the second joining neck portion 1025 protruding outward and tapering from the pad 1020 to the second routing trace 1050. In certain embodiments, the third pads 1030 are connected with the third routing traces 1060 through third joining neck portions 1035 of the third pads 1030. In some embodiments, the third pad 1030 may be shaped as an almost elliptical pad with the third joining neck portion 1035 protruding outward and tapering from the pad 1030 to the third routing trace 1060. In certain embodiments, the extending directions (e.g. the direction approaching the chip, arrow in FIG. 9A) of the joining neck portions and of the routing traces are along the semi-major axis of the almost elliptical pads. In some embodiments, the joining neck portions are designed to smoothly joining the pads and the routing traces, improving the reliability of the redistribution layer. In some embodiments, in FIG. 10A, the joining neck portions 1015, 1025, 1035 are located outside the span of the UBM patterns 180, thus lowering the line or trace break issues. One dimension (length) d1 of the first, second and third pads is set to be the same dimension (e.g. the diameter of the round pads or the length at the semi-major axis of the elliptical pads).

Figure 11A:
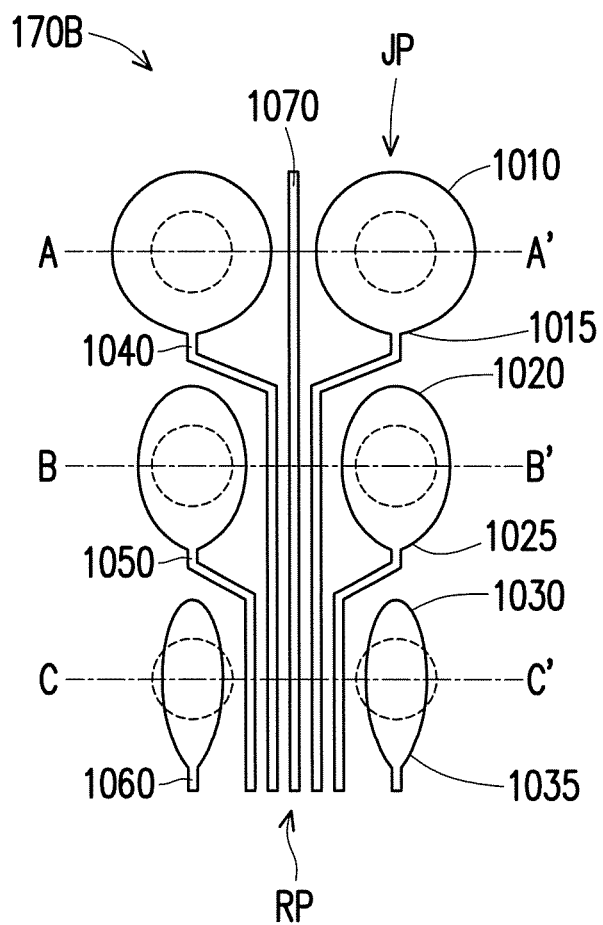
FIG. 11A is a schematic top view illustrating the exemplary layout of a portion of the redistribution layer in the package structure according to some exemplary embodiments of the present disclosure.
Figure 11B:
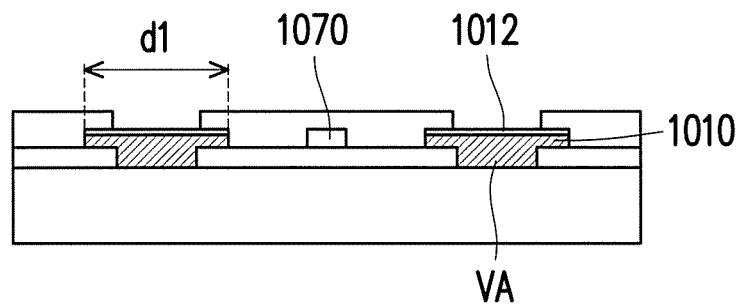
FIG. 11B is a schematic cross sectional view illustrating the first pads of the joining portions JP in FIG. 11A along the cross section line A-A'.

FIG. 11A is a schematic top view illustrating the exemplary layout of a portion of the redistribution layer 170B in the package structure according to some exemplary embodiments of the present disclosure. FIG. 11B is a schematic cross sectional view illustrating the first pads of the joining portions JP in FIG. 11A along the cross section line A-A'. Compared with the redistribution layer 170A of FIG. 10A, the redistribution layer 170B of FIG. 11A has no UBM patterns formed thereon. In some embodiments, no UBM patterns are formed before bonding the conductive elements to the pads of the joining portions, as shown in FIG. 11B, but a seed layer 1012 may be formed on the surfaces of the pads 1010 for enhancing adhesion between the pads and the overlying dielectric material layer and between the pads and the subsequently disposed conductive elements.

Figure 12:
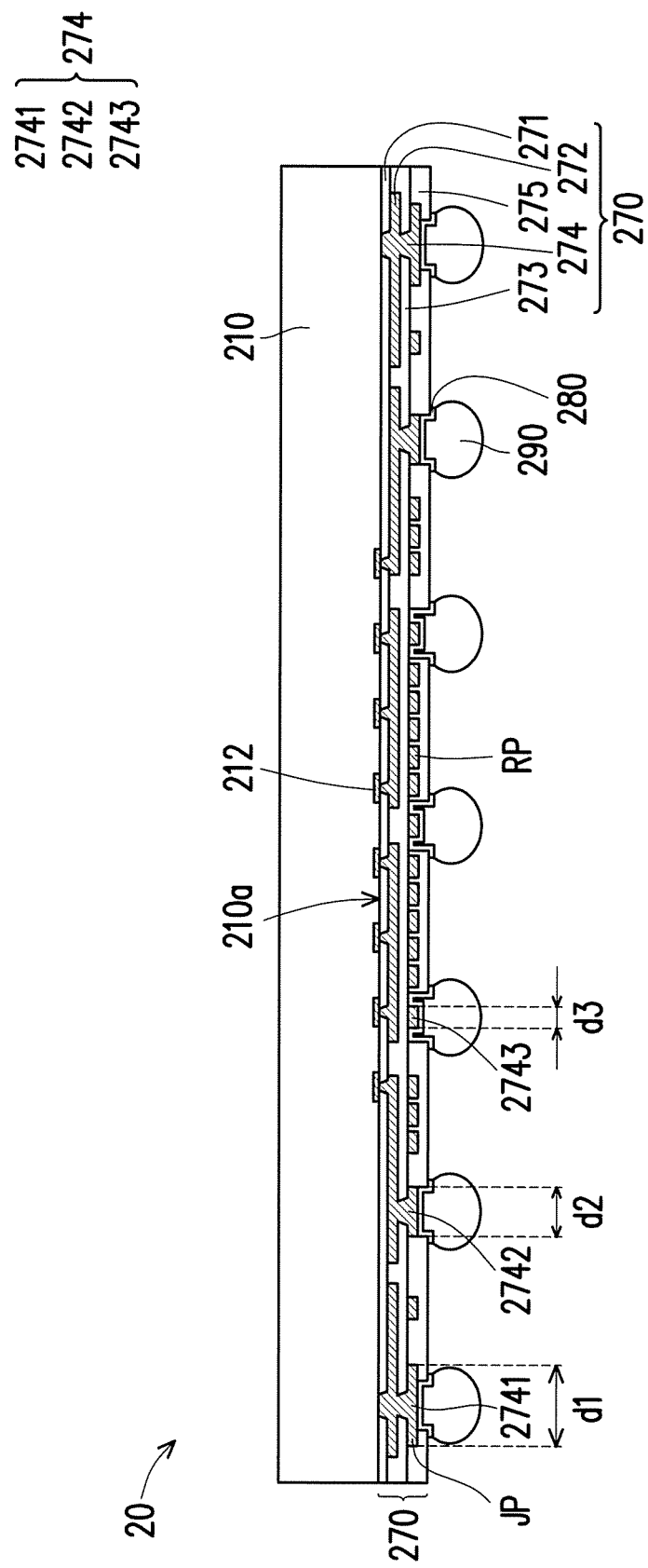
FIG. 12 is a schematic cross sectional view illustrating a semiconductor package according to some exemplary embodiments of the present disclosure.

FIG. 12 is a schematic cross sectional view illustrating a semiconductor package according to some exemplary embodiments of the present disclosure. In FIG. 12, in certain embodiments, a redistribution layer 270 is located on the active surface 210a of a chip 210. The redistribution layer 270 includes a lower dielectric material layer 271, a first metallization layer 272, a middle dielectric material layer 273, a second metallization layer 274 and a top dielectric material layer 275 sequentially stacked on the chip 210. In some embodiments, UBM patterns 280 are located on and connected to the joining portions JP of the second metallization layer 274. In some embodiments, conductive elements 290 are located and connected to the UBM patterns 280. In some embodiments, some or all of the conductive elements 290 are electrically connected with the chip 210 through the UBM patterns 280 and the redistribution layer 270.

In some embodiments, the joining portions JP of the redistribution layer 270 includes first pads 2741, second pads 2742 and third pads 2743. In some embodiments, the first, second and third pads 2741, 2742, and 2743 are of different shapes and sizes. In some embodiments, the first pads 2741 of a size d1 are arranged most far away from the center of the chip 210, while the third pads 2743 of a size d3 are arranged near or at the center of the chip 210. In some embodiments, the second pads 2742 of a size d2 are arranged between the first and third pads 2741, 2743. In some embodiments, the first size d1 is larger than the second size d2 and the second size d2 is larger than the third size d3. In some embodiments, the configuration and layout of the first, second and third pads 2741, 2742, 2743 are similar to the configuration and layout of the first, second and third pads 1741, 1742, 1743 of FIG. 9A, except the span of the chip 210 is substantially equivalent to the distribution span of the pads.

According to the above exemplary embodiments, the layout and configuration of the redistribution layer may be suitably formed within the integrated fan-out (InFO) wafer-level package structure or a fan-in wafer-level package structure. Although one redistribution layer is described in the above embodiments, more than one or multiple redistribution layers (RDLs) may be provided in the package structure or arranged on both front side and back side of the die(s) or chip(s) for signal redistributions among multiple dies or chips.

In certain embodiments, for the ball pads of the joining portions in the redistribution layer, by arranging narrower or elliptical pads in the inner region surrounding the die and larger or round pads in the outer region surrounding the die, more space between the adjacent pads is provided allowing routing portions or traces passing through, providing higher routing density and improving the reliability of the package. In certain embodiments, the pads closer to the die, the shorter the sizes at the semi-minor axis of the elliptical pads. In some embodiments, joining neck portions are formed between the pads and the routing traces of the redistribution layer, and the joining neck portions are designed to smoothly joining the pads and the routing traces, improving the reliability of the redistribution layer. In some embodiments, the joining neck portions are located outside the span of the UBM patterns, thus lowering the line or trace break issues.

According to some embodiments, a semiconductor package has at least a chip and a redistribution layer. The redistribution layer is disposed on the chip. The redistribution layer includes joining portions having first pads and second pads surrounding the chip. The first pads are arranged around a location of the chip and the second pads are arranged over the location of the chip. The second pads located closer to the chip are narrower than the first pads located further away from the chip.

According to some embodiments, a semiconductor package at least has a chip and a redistribution layer. The redistribution layer is disposed on the chip and electrically connected with the chip. The redistribution layer includes joining portions and routing portions. The joining portions include first pads and second pads surrounding the chip, and the first pads are located further away from the chip and the second pads are located closer to the chip. The routing portions include first routing traces and second routing traces respectively connected to the first and second pads and extending in a first direction approaching the chip. A first size in the first direction of the first pads is substantially equivalent to a second size in the first direction of the second pads, and the second pads have a third size in a second direction that is perpendicular to the first direction, and the third size is smaller than the second size.

According to some embodiments, a manufacturing method for semiconductor packages is provided. A chip is provided on a carrier. A redistribution layer having joining portions is formed on the chip, and the chip is electrically connected to the redistribution layer. The redistribution layer is formed by forming first pads located further away from the chip and forming second pads that are located closer to the chip and are narrow than the first pads. Conductive elements are disposed on the redistribution layer. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a chip;
   a redistribution layer disposed on an active surface of the chip, wherein the redistribution layer comprises a topmost dielectric material layer and joining portions, and the joining portions comprise first pads and second pads surrounding the chip, the first pads are arranged around a location of the chip, the second pads are arranged over the location of the chip, the first pads and the second pads are located at a same level of the redistribution layer, and the first pads are partially covered by the topmost dielectric material layer; and
   under-ball metallurgy (UBM) patterns disposed on the joining portions,
   wherein the second pads are located closer to the chip than the first pads, and the second pads are narrower in width than the first pads, the UBM patterns located on the second pads extend along and contact sidewalls and top surfaces of the second pads, and the UBM patterns disposed on the first pads contact top surfaces of the first pads.

2. The semiconductor package as claimed in claim 1, wherein the first pads are round pads having a diameter and the second pads are elliptical pads having a first length at a semi-major axis and a second length at a semi-minor axis, the diameter is substantially equivalent to the first length, and the second length is smaller than the first length.

3. The semiconductor package as claimed in claim 1, wherein the joining portions further comprise third pads surrounding the chip, the third pads are located around the location of the chip and are located between the first pads and the second pads, the third pads are located closer to the chip than the first pads and further away from the chip than the second pads, and the third pads are narrower than the first pads but are wider than the second pads.

4. The semiconductor package as claimed in claim 2, wherein the joining portions further comprise third pads located between the first pads and the second pads, the third pads are located closer to the chip than the first pads and further away from the chip than the second pads, the third pads are elliptical pads having a third length at a semi-major axis and a fourth length at a semi-minor axis, the diameter is substantially equivalent to the third length but larger than the fourth length and the fourth length is larger than the second length.

5. The semiconductor package as claimed in claim 3, wherein the redistribution layer further comprises routing portions, the routing portions comprise first routing traces connected to the first pads, second routing traces connected to the second pads and third routing traces connected to the third pads.

6. The semiconductor package as claimed in claim 5, wherein the first, second and third pads are respectively connected with the first, second and third routing traces through first, second and third joining neck portions.

7. The semiconductor package as claimed in claim 1, further comprising a molding compound disposed on the redistribution layer and encapsulating the chip.

8. The semiconductor package as claimed in claim 7, further comprising through interlayer vias (TIVs) located on the redistribution layer and through the molding compound and located aside the chip.

9. The semiconductor package as claimed in claim 1, further comprising conductive elements located on the UBM patterns.

10. The semiconductor package as claimed in claim 1, further comprising a seed layer respectively on the first, second and third pads of the joining portions and conductive elements located on the first, second and third pads of the joining portions.

11. A semiconductor package comprising:
    a chip; and
    a redistribution layer, disposed on the chip and electrically connected with the chip, wherein the redistribution layer comprises joining portions and routing portions, the joining portions comprise first pads and second pads surrounding the chip, and the second pads are located closer to the chip than the first pads,
    wherein the routing portions comprise first routing traces and second routing traces respectively connected to the first and second pads and extending in a first direction, and the first direction is a radial inward direction towards the chip, wherein a first length of the first pads in the first direction is substantially equivalent to a second length of the second pads in the first direction, the second pads have a third length in a second direction that is perpendicular to the first direction, the third length is smaller than the second length, and the first pads have a fourth length in the second direction which is substantially equivalent to the first length and the second length.

12. The semiconductor package as claimed in claim 11, wherein the joining portions further comprise third pads surrounding the chip, the third pads are located around the locations of the chip and are located between the first pads and the second pads, the third pads are located closer to the chip than the first pads and further away from the chip than the second pads, and a fifth length of the third pads in the second direction is larger than the third length.

13. The semiconductor package as claimed in claim 12, wherein the routing portions further comprise third routing traces connected to the third pads.

14. The semiconductor package as claimed in claim 13, wherein the first, second and third pads are respectively connected with the first, second and third routing traces through first, second and third joining neck portions.

15. The semiconductor package as claimed in claim 14, further comprising under-ball metallurgy (UBM) patterns located on the first, second and third pads of the joining portions, wherein the first, second and third joining neck portions are located outside of locations of the UBM patterns.

16. A manufacturing method for semiconductor packages, comprising:
providing a chip on a carrier;
forming a redistribution layer on the chip, wherein the chip is electrically connected to the redistribution layer, and wherein forming the redistribution layer comprises forming first pads surrounding the chip, forming second pads between the first pads and the chip, and forming a topmost dielectric material layer over the first and second pads, wherein the topmost dielectric material layer is formed with openings partially covering the first pads and exposing the second pads, and wherein the second pads are located closer to the chip than the first pads the second pads are narrower in width than the first pads, and top surfaces of the second pads have smaller areas than top surfaces of the first pads;
forming under-ball metallurgy (UBM) patterns on the second pads of the redistribution layer, wherein the under-ball metallurgy patterns extend along and contact sidewalls and the top surfaces of the second pads;
disposing conductive elements over the redistribution layer; and
removing the carrier.

17. The method as claimed in claim 16, wherein forming the redistribution layer further comprises forming third pads surrounding the chip, the third pads are located between the first pads and the second pads, the third pads are located closer to the chip than the first pads and further away from the chip than the second pads, and the third pads are narrower than the first pads but are wider than the second pads.

18. The method as claimed in claim 17, wherein forming the redistribution layer comprises forming routing portions, and the first, second and third pads are formed connected to the routing portions respectively through first, second and third joining neck portions of the first, second and third pads.

19. The method as claimed in claim 16, further comprising forming a molding compound over the carrier and encapsulating the chip before forming the redistribution layer.

20. The method as claimed in claim 16, further comprising forming additional under-ball metallurgy (UBM) patterns on the first pads of the redistribution layer.

* * * * *